United States Patent
Ko et al.

(10) Patent No.: US 6,314,029 B1
(45) Date of Patent: Nov. 6, 2001

(54) MEMORY DEVICE HAVING I/O SENSE AMPLIFIER WITH VARIABLE CURRENT GAIN

(75) Inventors: Tae-Young Ko, Koyang; Sang-jae Rhee, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/543,677

(22) Filed: Apr. 7, 2000

(30) Foreign Application Priority Data

Apr. 8, 1999 (KR) .................................................. 99-12323
Jan. 25, 2000 (KR) ................................................. 2000-3400

(51) Int. Cl.$^7$ ...................................................... G11C 7/08
(52) U.S. Cl. ..................... 365/190; 365/208; 365/230.03; 365/194; 365/196; 365/204; 365/51
(58) Field of Search .................................... 365/190, 205, 365/208, 230.03, 194, 195, 196, 51, 203, 204

(56) References Cited

U.S. PATENT DOCUMENTS 5,544,105 * 8/1996 Hirose et al. .................... 365/189.11

\* cited by examiner

*Primary Examiner*—Andrew Q. Tran
(74) *Attorney, Agent, or Firm*—F. Chau & Associates, LLP

(57) ABSTRACT

A semiconductor memory device having input/output sense amplifiers capable of varying gains using a column address and block selection signals. The input/output sense amplifiers can compensate for reduction of transfer rate according to distance between a selected memory block or sub memory block and the sense amplifiers. A semiconductor memory device of the present invention includes: a plurality of sub memory blocks divided by a column address in a memory block; a plurality of data input/output line pairs coupled to the sub memory blocks, for transmitting data in a selected sub memory block; and a plurality of input/output sense amplifiers for sensing and amplifying data from the data input/output line pairs, wherein each of the input/output sense amplifiers has a variable gain characteristic depending on distance between the selected sub memory block and the input/output sense amplifiers so as to minimize a difference in delay characteristic according to position of the selected sub memory block.

28 Claims, 9 Drawing Sheets

MEMORY DEVICE HAVING I/O SENSE AMPLIFIER WITH VARIABLE CURRENT GAIN

BACKGROUND OF THE INVENTION

1. Field of the Invention

The present invention relates to semiconductor memory devices, and more particularly, to an input/output sense amplifier which uses signals to vary current gain and to compensate for transmission delay.

2. Description of the Related Art

As integration density of semiconductor memory devices continues to increase, chip size also increases. Due to the increase in chip size, transmission rates of signals may be different depending upon differences in loading due to differences in physical lengths of signal lines. Different transmission rates of signals cause signal skewing, which in turn hinders the overall operating speed of a high-frequency semiconductor memory device.

FIG. 1 is a circuit diagram showing an output portion of a conventional semiconductor memory device. With reference to FIG. 1, data of memory cells coupled to a word line selected by a row address are transferred to data input/output lines by activation of a column selection signal selected by a column address. The data transferred to data input/output lines DIOi and DIOiB are output through an input/output sense amplifier (IOSA) to output lines FDOi and FDOiB. The data on the output lines FDOi and FDOiB are output through a driving circuit 10 to a data input/output pad DQ. The data to be output to the data input/output pad DQ is sampled in response to a predetermined sampling signal FRP in the driving circuit 10.

In a memory device having a plurality of memory blocks, IOSAs are arranged in a position which minimizes the difference between data input and output rates. However, distances from each memory block to the IOSA are typically different. Such a difference in the distance from each memory block to the IOSA causes load differences in signal lines which in turn causes IOSA data skew. To accommodate such data skew, data sampling period in the driving circuit 10 must be reduced. The reduction of the sampling period will be described with reference to the timing diagram of FIG. 2.

FIG. 2 is a timing diagram showing the reduction of a sampling period due to skew which has occurred between data input to the IOSA from a plurality of memory blocks. Here, an example of an ith memory block and a jth memory block, which is further away from the IOSA than the ith memory block, is described. Referring to FIG. 2, because the ith memory block is closer to the IOSA than the jth memory block, data read from the ith memory block is received by the IOSA earlier than data from the jth memory block. Thus, further considering a point in time where the data read from each memory block is sampled and input to a driving circuit 10, a point in time where data of the ith memory block is loaded onto the output line FDOi and a point in time where data of the jth memory block is loaded onto the output line FDOj are different.

The sampling signal FRP shown in FIG. 1, which is generated as a pulse signal, starts data sampling in synchronization with a leading edge of data which has last arrived at the IOSA and terminates the data sampling in synchronization with a trailing edge of data which has first arrived at the IOSA. Thus, as shown in FIG. 2, the sampling signal FRP has a sampling period corresponding to an overlapping period between the effective period of the jth memory block data FDOj and the effective period of the ith memory block data FDOi. The overlapping period is shorter than each effective period of the ith and jth memory block data FDOi and FDOj.

Thus, the sampling period of the sampling signal FRP is reduced by the skew between the data input to the IOSA from each memory block, the skew varying according to positions of memory blocks. In addition, such a reduction of the data sampling period may be a serious problem in a memory device which operates at a high frequency.

SUMMARY OF THE INVENTION

An object of the present invention is to provide a memory device having an input/output sense amplifier capable of minimizing data skew to avoid a reduction in sampling period.

The above and other objects of the present invention may be achieved by a semiconductor memory device comprising: a plurality of sub memory blocks divided by a column address in a memory block; a plurality of data input/output line pairs coupled to the sub memory blocks, for transmitting data in a selected sub memory block; and a plurality of input/output sense amplifiers for sensing and amplifying data from the data input/output line pairs, wherein each of the input/output sense amplifiers has a variable gain characteristic depending on physical distance between the selected sub memory block and the input/output sense amplifiers so as to minimize a difference in delay characteristic according to position of the selected sub memory block.

Preferably, a gain of each of the input/output sense amplifiers is controlled by the column address. Each of the input/output sense amplifiers may comprise: first and second load transistors sources of which are connected to one of the data input/output line pairs, and gates of which are cross-coupled with drains thereof; and at least two amplifiers which are selectively activated in response to the column address, for amplifying data transferred from the first and second load transistors with different gains.

Preferably, each of the at least two amplifiers comprises: first and second transistors each of which has a gate and a drain coupled to each other, drains of the first and second transistors being connected to drains of the first and second load transistors, respectively; and a switching circuit connected between sources of the first and second transistors and a ground voltage, for activating the corresponding amplifier in response to at least one column address having the most significant bit (MSB). Each of the at least two amplifiers may comprise: a first NMOS transistor having a gate and a drain, which are coupled to each other and coupled to a drain of a corresponding one of the first and second load transistors; and a compensation circuit coupled to the first NMOS transistor in parallel, the compensation circuit being controlled by the column address; wherein a switching circuit is coupled between sources of NMOS transistors of the at least two amplifiers and a ground voltage, for activating the input/output sense amplifiers in response to an input/output sense amplifying enable signal.

Each of the input/output sense amplifiers may include load transistor units between input/output lines to which memory cell data is input and output, and the data input/output lines, to provide current to the input/output lines. The load transistor units comprises a first load transistor for supplying current into the input/output lines when a selected sub memory block is relatively close to the input/output sense amplifiers, and a second load transistor for supplying current into the input/output lines when a selected sub memory block is far away from the input/output sense amplifiers.

Preferably, the first load transistor includes: a current driving controller for generating a current driving signal in response to the column address for selecting the sub memory blocks which are relatively close to the input/output sense amplifiers, and a driving signal which is activated in a read mode of the semiconductor memory device; a switching controller for generating a switching signal in response to the column address for selecting the sub memory blocks which are relatively close to the input/output sense amplifiers, and a control signal which is activated in the read mode; a current driver for supplying current to the input/output lines in response to the current driving signal; and a switching portion for connecting the input/output lines and the data input/output lines in response to the switching signal.

Preferably, the second load transistor includes: a current driving controller for generating a current driving signal in response to the column address for selecting the sub memory blocks which are far away from the input/output sense amplifiers, and a driving signal which is activated in a read mode of the semiconductor memory device; a switching controller for generating a switching signal in response to the column address for selecting the sub memory blocks which are far away from the input/output sense amplifiers, and a control signal which is activated in the read mode; a current driver for supplying current to the input/output lines in response to the current driving signals; a switching portion for connecting the input/output lines and the data input/output lines in response to the switching signal; and an auxiliary current driver for supplying current into the input/output lines in response to the current driving signal.

In a second embodiment of the present invention, there is provided a semiconductor memory device comprising: a plurality of memory blocks; a plurality of data input/output lines connected to the memory blocks, for transmitting data in a selected memory block; and a plurality of input/output sense amplifiers for sensing and amplifying the data of the data input/output lines, wherein each of the input/output sense amplifier has a variable gain characteristic depending on physical distance between the selected memory block and the input/output sense amplifiers, so as to minimize a difference in delay characteristic according to position of the selected memory block.

In a third embodiment of the present invention, there is provided a semiconductor memory device comprising: a plurality of memory blocks; a plurality of sub memory blocks divided by a column address in each memory block; a plurality of data input/output lines connected to the memory blocks, for transmitting data in a selected sub memory block; and a plurality of input/output sense amplifiers for sensing and amplifying data from the data input/output lines, wherein each of the input/output sense amplifiers has a variable gain characteristic depending on physical distance between the selected memory block and the input/output sense amplifiers and distance between the selected sub memory block and the input/output sense amplifiers, so as to minimize a difference in delay characteristic according to positions of a selected memory block and the selected sub memory block.

In a fourth embodiment of the present invention, there is provided a semiconductor memory device comprising: a plurality of sub memory blocks divided by a column address in a memory block; a plurality of input/output lines coupled to the sub memory blocks, for transmitting data in a selected sub memory block; a plurality of data input/output lines to which data of the input/output lines is transmitted; a plurality of input/output sense amplifiers for sensing and amplifying data from the data input/output lines; and a plurality of load circuits coupled between the input/output lines and the data input/output lines, for varying amount of current supplied to the input/output line in response to the column address so as to minimize a difference in delay characteristic according to position of the selected sub memory block.

In a fifth embodiment of the present invention, there is provided a semiconductor memory device comprising: a plurality of memory blocks; a plurality of input/output lines coupled to the memory blocks, respectively, for transmitting data in a selected memory block; a plurality of data input/output lines to which data of the input/output lines are transmitted; a plurality of input/output sense amplifiers for sensing and amplifying data from the data input/output lines, and a plurality of load circuits coupled between the input/output lines and the data input/output lines, for varying amount of current supplied to the input/output lines, in response to a plurality of block selection signals for selecting one of the memory blocks, so as to minimize a difference in delay characteristic from the input/output sense amplifiers according to position of the selected memory block.

In a sixth embodiment of the present invention, there is provided a semiconductor memory device comprising: a plurality of memory blocks; a plurality of sub memory blocks divided by a column address in each memory block; a plurality of input/output lines coupled to the memory blocks, respectively, for transmitting data in a selected sub memory block; a plurality of data input/output lines to which data of the input/output lines are selectively transmitted; a plurality of input/output sense amplifiers for sensing and amplifying data from the data input/output lines; and a plurality of load circuits coupled between the input/output lines and the data input/output lines, for varying amount of current supplied to the input/output lines in response to a plurality of block selection signals for selecting one of the memory blocks and the column address, so as to minimize a difference in delay characteristic according to positions of a selected memory block and the selected sub memory block.

Therefore, in the semiconductor memory devices according to the present invention, the gain of each of the input/output sense amplifiers can be controlled in consideration of the load of data onto the data input/output lines, in response to the column address and block selection signals, thereby reducing skew in outputting data from the input/output sense amplifiers.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
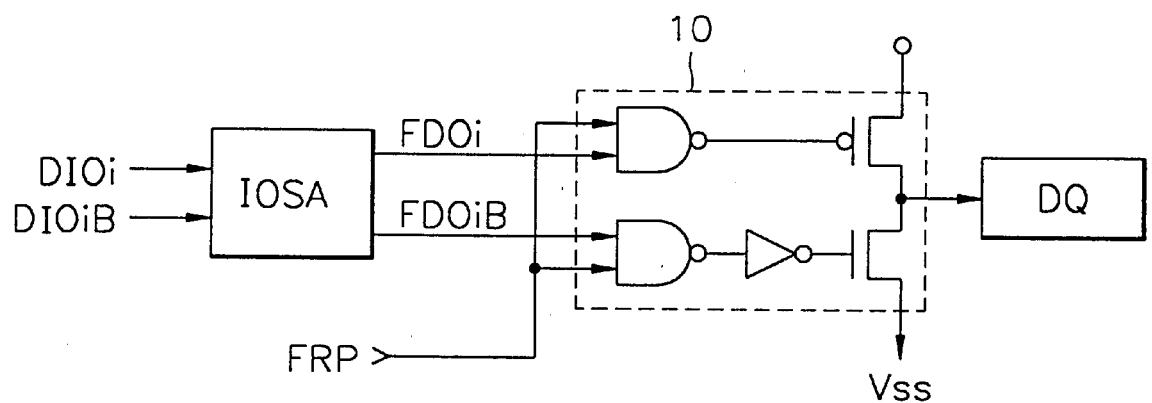
FIG. 1 is a circuit diagram showing a part of an output end of a conventional memory device.
Figure 2:
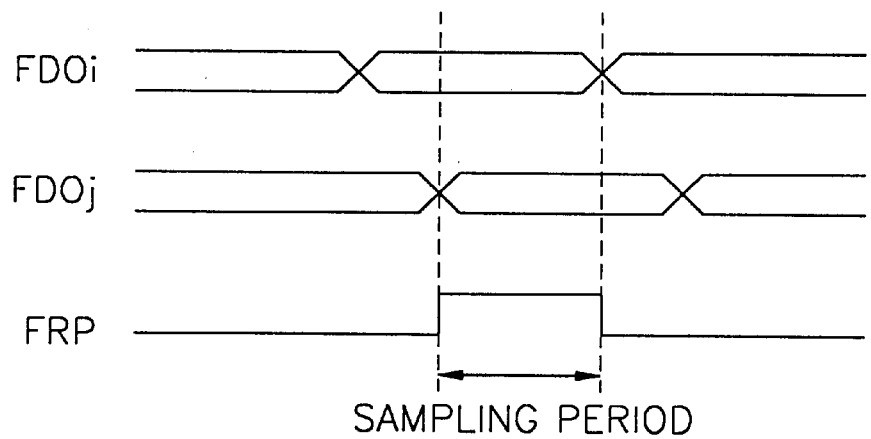
FIG. 2 is a timing diagram showing a reduction of a sampling period due to skew which has occurred among data input to the data output end of FIG. 1.
Figure 3:
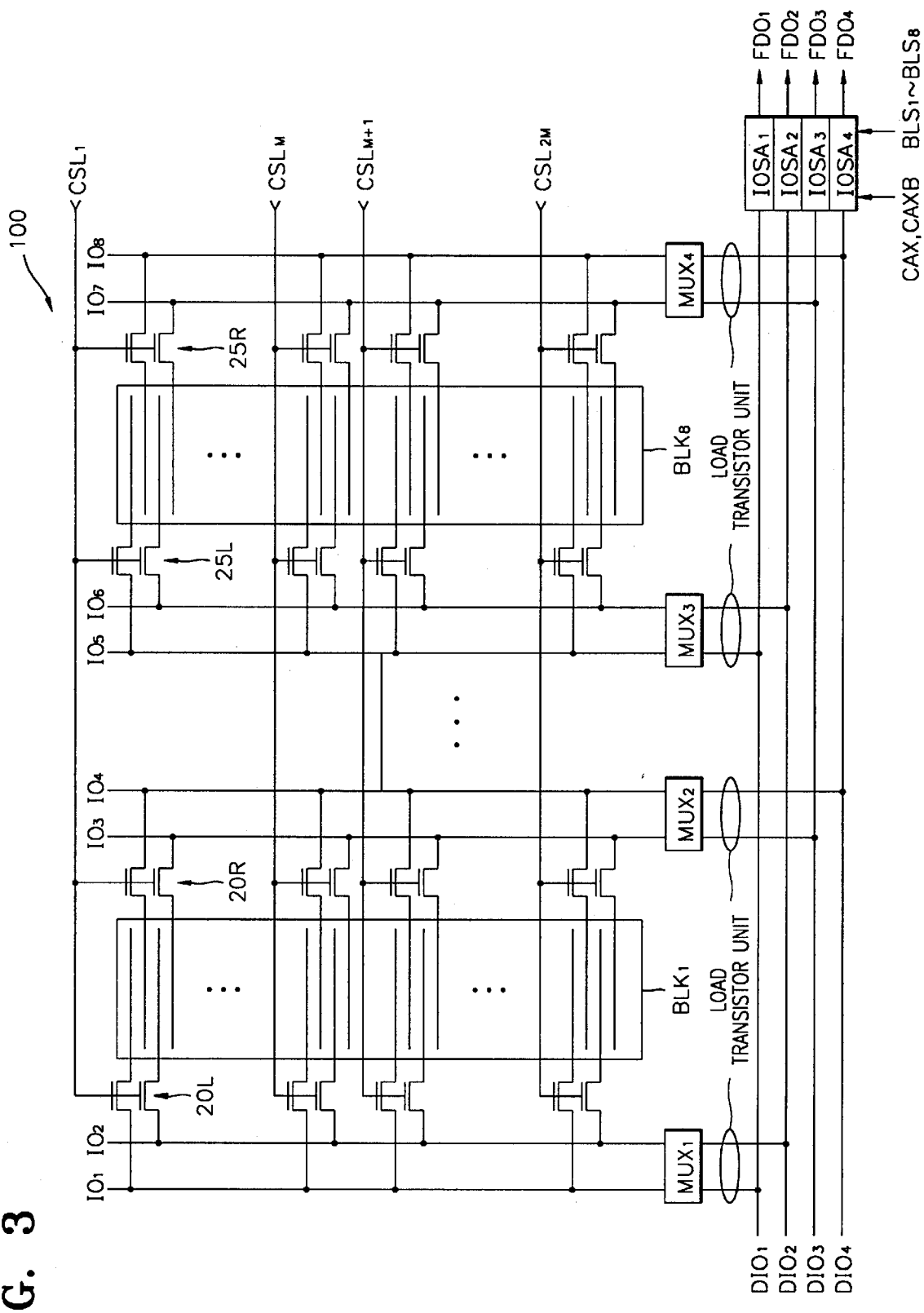
FIG. 3 is a schematic block diagram of a memory device having input/output sense amplifiers (IOSAs) according to the present invention.

With reference to FIG. 3, a schematic block diagram of a memory device 100 according to a preferred embodiment of the present invention is shown. For convenience of explanation and illustration, the memory device 100 has eight memory blocks $BLK_1$ through $BLK_8$, and four data input/output lines $DIO_1$, $DIO_2$, $DIO_3$ and $DIO_4$.

The memory device 100 includes first through eighth memory blocks $BLK_1$ through $BLK_8$, a plurality of column selection signals $CSL_1$ through $CSL_M$ and $CSL_{M+1}$ through $CSL_{2M}$, which are common in the memory blocks $BLK_1$ through $BLK_8$, and a plurality of column selection switches 20L, 20R, 25L and 25R, which are all coupled to each of the column selection signals $CSL_1$ through $CSL_M$ and $CSL_{M+1}$ through $CSL_{2M}$. Also, the memory device 100 according to the present invention comprises a plurality of input/output lines $IO_1$ through $IO_8$, which are coupled to the column selection switches 20L, 20R, 25L and 25R, input/output multiplexers $MUX_1$ through $MUX_4$, which connect the input/output lines $IO_1$ through $IO_8$ and the data input/output lines $DIO_1$ through $DIO_4$, and input/output sense amplifiers $IOSA_1$ through $IOSA_4$, which are coupled to the data input/output lines $DIO_1$ through $DIO_4$, respectively.

The column selection signals $CSL_1$ through $CSL_{2M}$ selectively turn on the column selection switches 20L, 20R, 25L and 25R to select a predetermined bit line in the first through eighth memory blocks $BLK_1$ through $BLK_8$. Data of the selected bit line is transferred to corresponding input/output lines $IO_1$ through $IO_8$. The input/output multiplexers $MUX_1$ through $MUX_4$ select one of the first through eighth memory blocks $BLK_1$ through $BLK_8$ and connect the input/output lines of the selected memory block to the data input/output lines $DIO_1$ through $DIO_4$. The bit line data of the selected memory block is transferred through the corresponding input/output lines to the data input/output lines $DIO_1$ through $DIO_4$.

The input/output sense amplifiers $IOSA_1$, $IOSA_2$, $IOSA_3$ and $IOSA_4$ sense and amplify the data transferred to the data input/output lines $DIO_1$, $DIO_2$, $DIO_3$ and $DIO_4$. The input/output sense amplifiers $IOSA_1$, $IOSA_2$, $IOSA_3$ and $IOSA_4$ sense and amplify the amount of current applied to the data input/output lines $DIO_1$ through $DIO_4$. In the present embodiment, each of the input/output sense amplifiers $IOSA_1$, $IOSA_2$, $IOSA_3$ and $IOSA_4$ is controlled by predetermined control signals. The control signals may be column addresses CAX and CAXB, block selection signals $BLS_1$ through $BLS_8$ for selecting one of the plurality of memory blocks, or a combination of these column addresses and block selection signals. In particular, the column addresses CAX and CAXB may be the most significant bit MSB of the column addresses or a plurality of column addresses CAXi and CAXBi including the MSB.

Each of the memory blocks $BLK_1$ through $BLK_8$ is divided into sub memory blocks by the column selection signals $CSL_1$ through $CSL_{2M}$. In the present embodiment, it is assumed that the memory blocks $BLK_1$ through $BLK_8$ are divided into two sub memory blocks by two groups of column selection signals, i.e., the upper column selection signals $CSL_1$ through $CSL_M$, and the lower column selection signals $CSL_{M+1}$ through $CSL_{2M}$. The selection of the upper column selection signals $CSL_1$ through $CSL_M$ or the lower column selection signals $CSL_{M+1}$ through $CSL_{2M}$ is determined by the MSB of the column address. When the upper column selection signals $CSL_1$ through $CSL_M$ are selected by the column address CAX, the input/output sense amplifiers $IOSA_1$, $IOSA_2$, $IOSA_3$ and $IOSA_4$ amplify input data with a high gain in response to the column address CAX. When the lower column selection signals $CSL_{M+1}$ through $CSL_{2M}$ are selected by the inverted column address CAXB, the input/output sense amplifiers $IOSA_1$, $IOSA_2$, $IOSA_3$ and $IOSA_4$ amplify input data with a low gain in response to the inverted column address CAXB.

As described above, in the input/output sense amplifiers $IOSA_1$, $IOSA_2$, $IOSA_3$ and $IOSA_4$ according to the present invention, when a sub memory block which is far away from $IOSA_1$, $IOSA_2$, $IOSA_3$ and $IOSA_4$, is selected, for example, when the column address CAX for enabling one of the upper column selection signals $CSL_1$ through $CSL_M$ is input, the input/output sense amplifiers $IOSA_1$ through $IOSA_4$ amplify the input data with a high gain in response to the column address CAX. Meanwhile, when a sub memory block which is close to the input/output sense amplifiers $IOSA_1$, $IOSA_2$, $IOSA_3$ and $IOSA_4$, is selected, for example, when the inverted column address CAXB for enabling one of the lower column selection signals $CSL_{M+1}$ through $CSL_{2M}$ is input, the input/output sense amplifiers $IOSA_1$ through $IOSA_4$ amplify the input data with a low gain in response to the inverted column address CAXB.

The input/output sense amplifiers $IOSA_1$, $IOSA_2$, $IOSA_3$ and $IOSA_4$ according to the present invention can control the gain according to the block selection signals $BLS_1$ through $BLS_8$, besides the column address CAX and the inverted column address CAXB.

The input/output sense amplifiers $IOSA_1$, $IOSA_2$, $IOSA_3$ and $IOSA_4$ sense and amplify the data transferred through the data input/output lines $DIO_1$ through $DIO_4$ with different gains depending on physical distance from a selected memory block to the input/output sense amplifiers $IOSA_1$, $IOSA_2$, $IOSA_3$ and $IOSA_4$. For example, when the selected memory block is far away from the input/output sense amplifiers $IOSA_1$, $IOSA_2$, $IOSA_3$ and $IOSA_4$, they amplify the transferred data with a high gain. Meanwhile, when the selected memory block is close to the input/output sense amplifiers $IOSA_1$, $IOSA_2$, $IOSA_3$ and $IOSA_4$, they amplify the transferred data with a low gain.

For example, it is assumed that the eight memory blocks $BLK_1$ through $BLK_8$ are divided into two. When the first through fourth memory blocks $BLK_1$ through $BLK_4$, which are far away from the input/output sense amplifiers $IOSA_1$, $IOSA_2$, $IOSA_3$ and $IOSA_4$, are selected, gain of the input/output sense amplifiers $IOSA_1$, $IOSA_2$, $IOSA_3$ and $IOSA_4$ is increased. Meanwhile, when the fifth through eighth memory blocks $BLK_5$ through $BLK_8$, which are near $IOSA_1$, $IOSA_2$, $IOSA_3$ and $IOSA_4$, are selected, the gain of the input/output sense amplifiers $IOSA_1$, $IOSA_2$, $IOSA_3$ and $IOSA_4$ is decreased.

Embodiments of the input/output sense amplifiers $IOSA_1$, $IOSA_2$, $IOSA_3$ and $IOSA_4$ will be described in greater detail with reference to FIGS. 4 through 10. In the following embodiments, the input/output sense amplifiers $IOSA_1$, $IOSA_2$, $IOSA_3$ and $IOSA_4$ are implemented by current sense amplifiers, and output signals FDOi and FDOiB of the current sense amplifiers are provided as input signals of a voltage sense amplifier (not shown). Structure and function of a voltage sense amplifier is well known to those skilled in the art, and thus an explanation thereof is not provided. In the following embodiments, it is assumed that the upper column selection signals $CSL_1$ through $CSL_M$ are selected by the MSB of the column address CAX, and the lower column selection signals $CSL_{M+1}$ through $CSL_{2M}$ are selected by the inverted column address CAXB.

Embodiment 1

Figure 4:
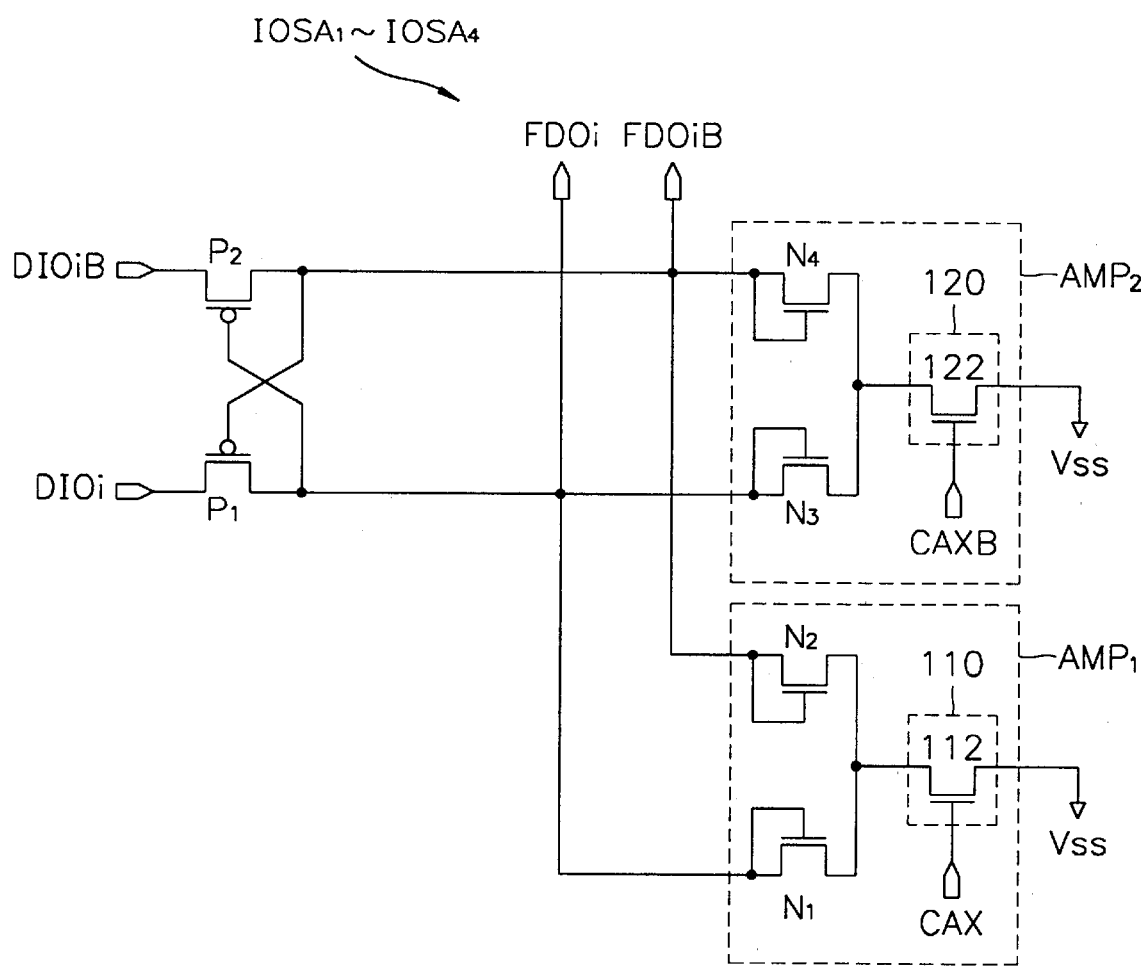
FIG. 4 is a circuit diagram of a first embodiment of the IOSAs shown in FIG. 3.

Turning now to FIG. 4, which is a circuit diagram of a first embodiment of the input/output sense amplifiers $IOSA_1$, $IOSA_2$, $IOSA_3$ and $IOSA_4$ shown in FIG. 3 according to the present invention, an example where each input/output sense amplifier is constructed of two amplifiers $AMP_1$ and $AMP_2$ is shown. Data input/output line pair DIOi and DIOBi of FIG. 4 represent each of the data input/output lines $DIO_1$ through $DIO_4$ shown in FIG. 3.

Each of the input/output sense amplifiers $IOSA_1$, $IOSA_2$, $IOSA_3$ and $IOSA_4$ includes first and second load transistors $P_1$ and $P_2$, and first and second amplifiers $AMP_1$ and $AMP_2$. The first and second load transistors $P_1$ and $P_2$ are provided in the data input/output line pair DIOi and DIOiB, respectively, and each of the first and second load transistors $P_1$ and $P_2$ is shared by the first and second amplifiers $AMP_1$ and $AMP_2$.

Sources of the first and second load transistors $P_1$ and $P_2$ are connected to the data input/output line pair DIOi and DIOiB, respectively, and gates of the first and second load transistors $P_1$ and $P_2$ are cross-coupled with drains thereof. The first and second amplifiers $AMP_1$ and $AMP_2$ are implemented such that gain of an input/output sense amplifier including the first and second amplifiers $AMP_1$ and $AMP_2$ can be varied. The first and second amplifiers $AMP_1$ and $AMP_2$ are selectively activated according to position of a memory cell to be read.

For example, assuming that gain of the first amplifier $AMP_1$ is higher than that of the second amplifier $AMP_2$, the first amplifier $AMP_1$ is activated when a sub memory block, which is far away from the input/output sense amplifiers $IOSA_1$, $IOSA_2$, $IOSA_3$ and $IOSA_4$, is selected. Conversely, when a sub memory block, which is near the input/output sense amplifiers $IOSA_1$, $IOSA_2$, $IOSA_3$ and $IOSA_4$, is selected, the second amplifier $AMP_2$ is activated. Preferably, the first amplifier $AMP_1$ includes first and second NMOS transistors $N_1$ and $N_2$ and a switching circuit 110, and the second amplifier $AMP_2$ includes first and second NMOS transistors $N_3$ and $N_4$ and a switching circuit 120.

Gates of the respective NMOS transistors $N_1$, $N_2$, $N_3$ and $N_4$ are coupled to drains thereof, and the drains of the respective NMOS transistors $N_1$, $N_2$, $N_3$ and $N_4$ are coupled to drains of the first and second load transistors $P_1$ and $P_2$, respectively. Also, as shown in FIG. 4, each of the switching circuits 110 and 120 includes one NMOS transistor, for example, NMOS transistors 112 and 122, respectively. The NMOS transistors 112 and 122 are selectively turned on by the column address CAX and the inverted column address CAXB. The column address may be the MSB or a plurality of column addresses including the MSB.

Gain of such a current sense input/output amplifier, which represents a gain ratio of input data to output data of the data input/output lines DIOi and DIOiB, can be controlled by changing transfer characteristics of the transistors of the current sense input/output amplifier. For example, if size of the first and second load transistors $P_1$ and $P_2$ is increased for a high current input, or if size of the first and second NMOS transistors $N_1$, $N_2$, $N_3$ and $N_4$ is reduced for a low current output, gain of the input/output sense amplifiers $IOSA_1$, $IOSA_2$, $IOSA_3$ and $IOSA_4$ can be increased.

It is desirable that the first and second load transistors $P_1$ and $P_2$ are designed to provide better transfer characteristics than the first and second NMOS transistors $N_1$, $N_2$, $N_3$ and $N_4$. The gains of the first and second amplifiers $AMP_1$ and $AMP_2$ can be varied by forming the first and second NMOS transistors $N_1$ and $N_2$ of the first amplifier $AMP_1$ to have a different size or to have a different voltage from that of the first and second amplifiers $N_3$ and $N_4$ of the second amplifier $AMP_2$. For example, if the first and second NMOS transistors $N_1$ and $N_2$ of the first amplifier $AMP_1$ are designed to be smaller than the first and second NMOS transistors $N_3$ and $N_4$ of the second amplifier $AMP_2$, the gain of the first amplifier $AMP_1$ can be made higher than that of the second amplifier $AMP_2$.

Also, in the case where the gain of the first amplifier $AMP_1$ is higher than that of the second amplifier $AMP_2$, the switching circuit 110 of the first amplifier $AMP_1$ is controlled by the column address CAX, which selects the upper column selection signals $CSL_1$ through $CSL_M$ (see FIG. 3), and the switching circuit 120 of the second amplifier $AMP_2$ is controlled by the inverted column address CAXB, which selects the lower column selection signals $CSL_{M+1}$ through $CSL_{2M}$.

In this case, if a sub memory block that is far away from the input/output sense amplifiers $IOSA_1$, $IOSA_2$, $IOSA_3$ and $IOSA_4$ is selected, the first amplifiers $AMP_1$ of the input/output sense amplifiers $IOSA_1$, $IOSA_2$, $IOSA_3$ and $IOSA_4$, which are designed to have a higher gain than the second amplifiers $AMP_2$ thereof, are activated in response to the column address CAX, thereby rapidly sensing and amplifying the data transferred through the data input/output lines DIOi and DIOiB.

Conversely, if a sub memory block that is relatively close to the input/output sense amplifiers $IOSA_1$, $IOSA_2$, $IOSA_3$ and $IOSA_4$ is selected, the second amplifiers $AMP_2$ of the input/output sense amplifiers $IOSA_1$, $IOSA_2$, $IOSA_3$ and $IOSA_4$, which are designed to have a lower gain than the first amplifiers $AMP_1$ thereof, are activated in response to the inverted column address CAXB. As a result, the data transferred through the data input/output lines DIOi and DIOiB are sensed and amplified more slowly by the second amplifier $AMP_2$ than by the first amplifier $AMP_1$.

In the present embodiment, in the case where a sub memory block that is far away from the input/output sense amplifiers $IOSA_1$, $IOSA_2$, $IOSA_3$ and $IOSA_4$ is selected, a reduction in a data transfer rate due to the distance between the selected sub memory block and the input/output sense amplifiers can be compensated for by an increase in the gains of the input/output sense amplifiers $IOSA_1$, $IOSA_2$, $IOSA_3$ and $IOSA_4$, thus minimizing skew in data $FDO_1$, $FDO_2$, $FDO_3$ and $FDO_4$ (see FIG. 3) output from the input/output sense amplifiers $IOSA_1$, $IOSA_2$, $IOSA_3$ and $IOSA_4$.

The present embodiment has introduced the case where each input/output sense amplifier has two different gains. However, the input/output sense amplifier may be configured to have more than two gains. In such cases, each of the input/output sense amplifiers $IOSA_1$, $IOSA_2$, $IOSA_3$ and $IOSA_4$ comprises more than two amplifiers, and each amplifier is controlled by a plurality of column addresses and inverted column addresses including the MSB. Also, it is appreciated that first and second transistors of each amplifier are designed to have different sizes.

Embodiment 2

Figure 5:
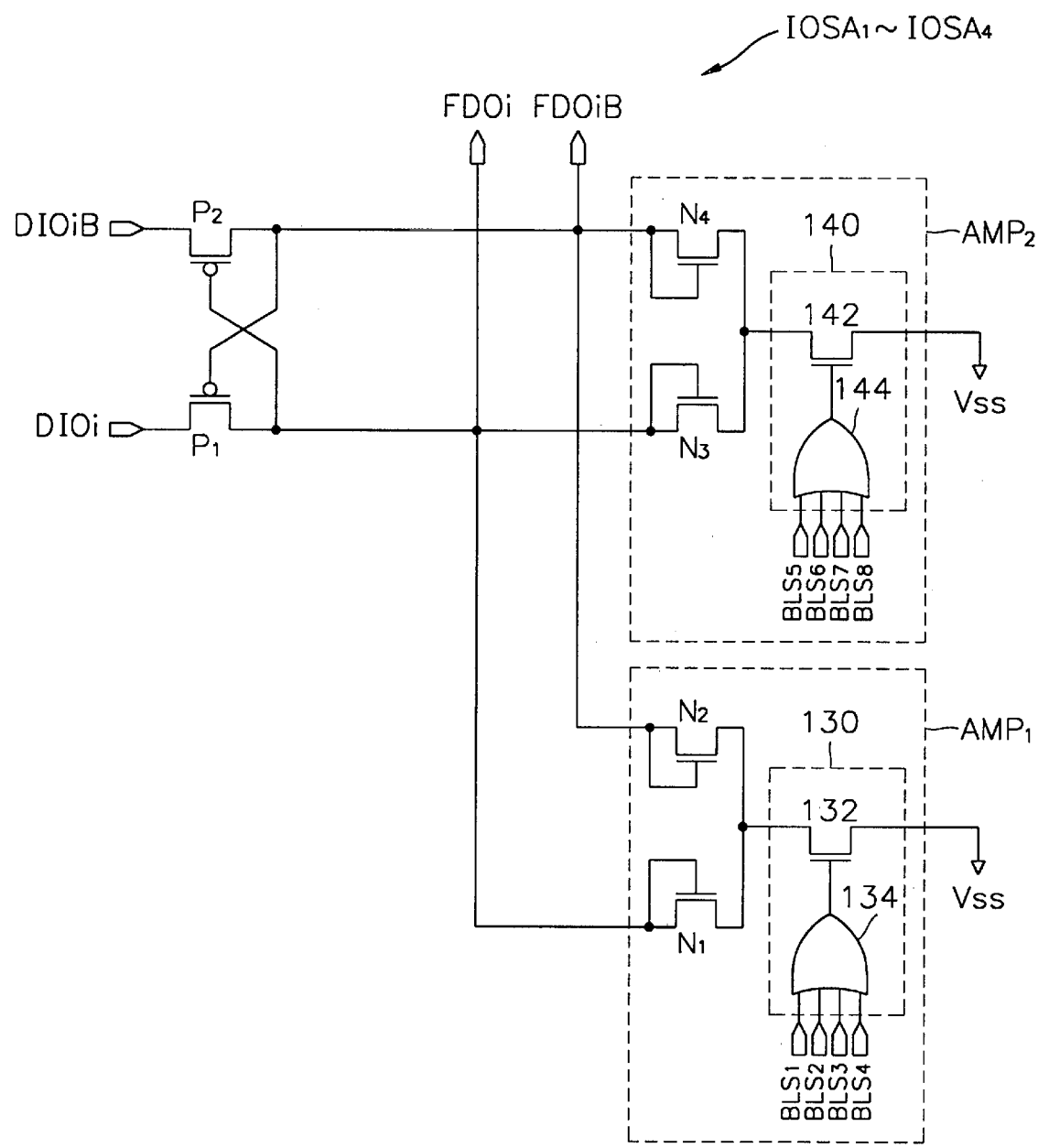
FIG. 5 is a circuit diagram of a second embodiment of the IOSAs shown in FIG. 3.

FIG. 5 is a circuit diagram of a second embodiment of the input/output sense amplifiers $IOSA_1$, $IOSA_2$, $IOSA_3$ and $IOSA_4$ shown in FIG. 3 according to the present invention. In FIG. 5, like reference numerals are used to designate elements which are identical to those in FIG. 4. The present embodiment is identical to the Embodiment 1 in FIG. 4, except that switching circuits 130 and 140 are designed to be controlled by block selection signals $BLS_1$ through $BLS_8$. Thus, except for the switching circuits 130 and 140, an explanation of configuration and function of the input/output sense amplifiers shown in FIG. 5 is the same as that of FIG. 4 and is not provided.

In the present embodiment, the first and second amplifiers $AMP_1$ and $AMP_2$ are selectively activated according to positions of selected memory blocks. That is, the switching circuits 130 and 140 are controlled by the block selection signals $BLS_1$ through $BLS_8$, and then activate one of the first and second amplifiers $AMP_1$ and $AMP_2$. The switching circuits 130 and 140 include NMOS transistors 132 and 142, respectively, and logic gates 134 and 144, respectively. The NMOS transistors 132 and 142 are turned on by output signals of the logic gates 134 and 144, respectively. The logic gates 134 and 144 each may be, for example, a 4-input OR gate, which activate the NMOS transistors 132 and 142, respectively, when at least one of the block selection signals BLS, through $BLS_8$, which is input to the corresponding switching circuit 130 or 140, is activated. Also, the logic gate 134 and 144 each may be configured to a 4-input NAND gate. In such case, inverted block selection signals are input to a corresponding NAND gate.

In a similar manner as in Embodiment 1, gains of the first and second amplifiers $AMP_1$ and $AMP_2$ can be varied by designing the first and second NMOS transistors $N_1$ and $N_2$ of the first amplifier $AMP_1$, to have a different size or to have a different threshold voltage from that of the first and second NMOS transistors $N_3$ and $N_4$ of the second amplifier $AMP_2$.

In the case where the gain of the first amplifier $AMP_1$ is higher than that of the second amplifier $AMP_2$, the switching circuit 130 of the first amplifier $AMP_1$ is controlled by the block selection signals $BLS_1$ through $BLS_4$, which select the first through fourth memory blocks $BLK_1$ through $BLK_4$ which are far away from the input/output sense amplifiers. Meanwhile, the switching circuit 140 of the second amplifier $AMP_2$ is controlled by the block selection signals $BLS_5$ through $BLS_8$, which select the fifth through eighth memory blocks $BLK_5$ through $BLK_8$ which are near the input/output sense amplifiers.

As already described, when one of the block selection signals $BLS_1$ through $BLS_4$, which select the memory blocks $BLK_1$ through $BLK_4$ which are far away from the input/output sense amplifiers $IOSA_1$, $IOSA_2$, $IOSA_3$ and $IOSA_4$, is input to the input/output sense amplifiers $IOSA_1$, $IOSA_2$, $IOSA_3$ and $IOSA_4$, the first amplifiers $AMP_1$ of the input/output sense amplifiers $IOSA_1$, $IOSA_2$, $IOSA_3$ and $IOSA_4$, which have a higher gain than the second amplifiers $AMP_2$ thereof, are activated in response to the input block selection signal. Conversely, when one of the block selection signals $BLS_5$ through $BLS_8$, which select the memory blocks $BLK_5$ through $BLK_8$ which are relatively close to the input/output sense amplifiers $IOSA_1$, $IOSA_2$, $IOSA_3$ and $IOSA_4$, is input, the second amplifiers $AMP_2$ of the input/output sense amplifiers $IOSA_1$, $IOSA_2$, $IOSA_3$ and $IOSA_4$, which have a lower gain than the first amplifiers $AMP_1$ thereof, are activated in response to the input block selection signal.

In the case where a memory block that is far away from the input/output sense amplifiers is selected, reduction of transfer rate due to distance between the selected memory block and the input/output sense amplifiers can be compensated for by increasing gains of input/output sense amplifiers, thus minimizing skew in data $FDO_1$, $FDO_2$, $FDO_3$ and $FDO_4$ (see FIG. 3) output from the input/output sense amplifiers $IOSA_1$, $IOSA_2$, $IOSA_3$ and $IOSA_4$, as in Embodiment 1.

The present embodiment has introduced the case where each of the input/output sense amplifiers $IOSA_1$, $IOSA_2$, $IOSA_3$ and $IOSA_4$ has two different gains. However, each input/output sense amplifier may be implemented to have more than two gains. For example, in the case of having eight memory blocks, the eight memory blocks are divided into four, and four amplifiers capable of having different gains, are provided to each of the input/output sense amplifiers $IOSA_1$, $IOSA_2$, $IOSA_3$ and $IOSA_4$.

Embodiment 3

Figure 6:
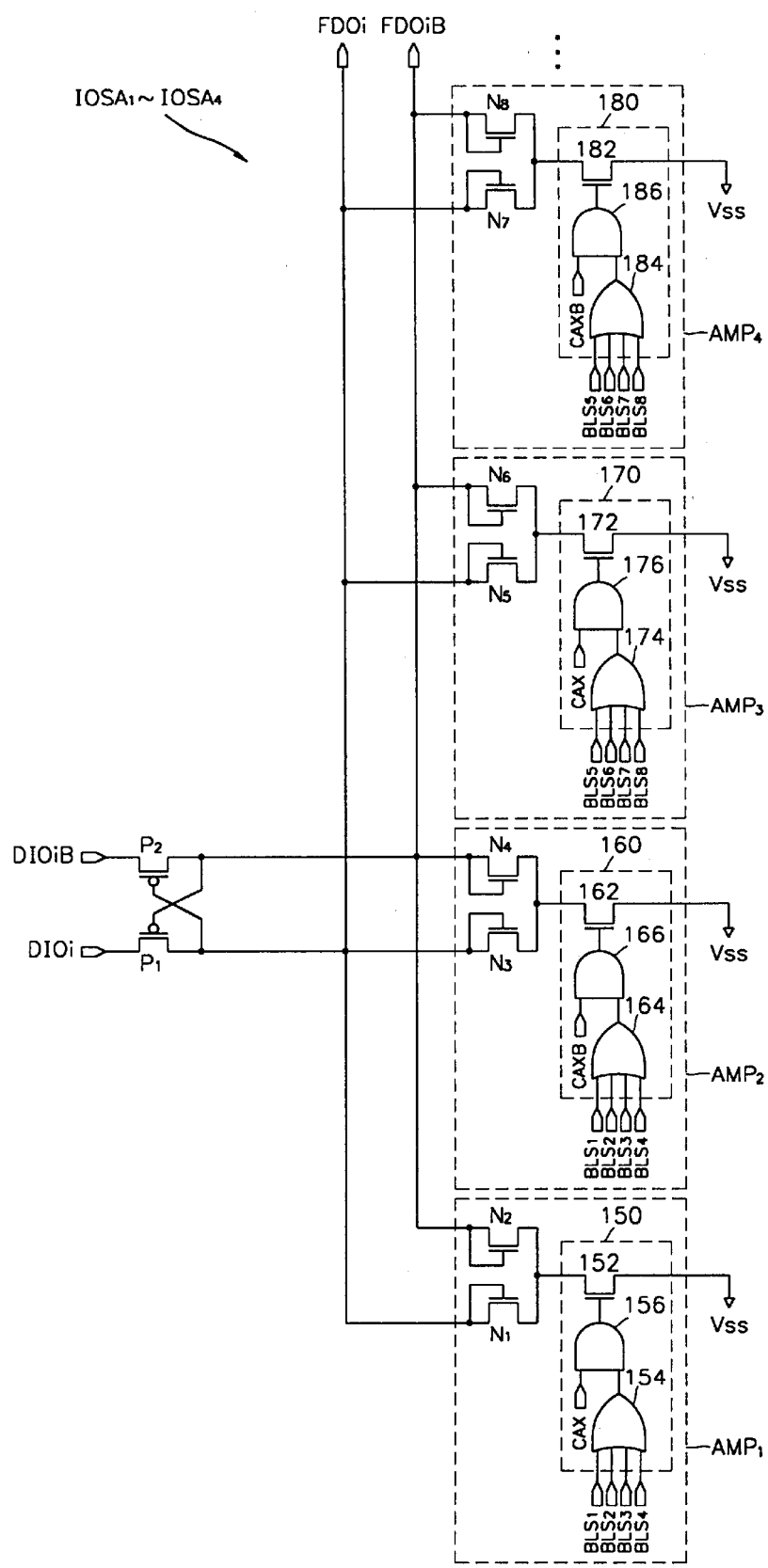
FIG. 6 is a circuit diagram of a third embodiment of the IOSAs shown in FIG. 3.

FIG. 6 is a circuit diagram of a third embodiment of the input/output sense amplifiers $IOSA_1$, $IOSA_2$, $IOSA_3$ and $IOSA_4$ shown in FIG. 3 according to the present invention. FIG. 6 shows a case where each input/output sense amplifier includes first through fourth amplifiers $AMP_1$, $AMP_2$, $AMP_3$ and $AMP_4$. The present embodiment is identical to Embodiments 1 and 2, except that switching circuits 150, 160, 170 and 180 are designed to be controlled by column addresses CAX and CAXB and block selection signals $BLS_1$ through $BLS_8$. Thus, except for the switching circuits 150, 160, 170 and 180, an explanation of configuration and function of the input/output sense amplifiers shown in FIG. 6 is the same as that of FIG. 3 and is not provided.

In the present embodiment, one of the first through fourth amplifiers $AMP_1$, $AMP_2$, $AMP_3$ and $AMP_4$ is selectively activated according to positions of selected sub memory blocks and memory blocks. That is, the switching circuits 150, 160, 170 and 180 are activated by the column addresses CAX and CAXB and the block selection signals $BLS_1$ through $BLS_8$, thereby selectively activating one of the first through fourth amplifiers $AMP_1$, $AMP_2$, $AMP_3$ and $AMP_4$.

Each of the switching circuits 150, 160, 170 and 180 according to the present embodiment, as shown in FIG. 6, comprises one NMOS transistor and two logic gates. That is, the switching circuit 150 comprises an NMOS transistor 152 and first and second logic gates 154 and 156, the switching circuit 160 comprises an NMOS transistor 162 and first and second logic gates 164 and 166, the switching circuit 170 comprises an NMOS transistor 172 and first and second logic gates 174 and 176 , and the switching circuit 180 comprises an NMOS transistor 182 and first and second logic gates 184 and 186. The first logic gates 154, 164, 174 and 184 may be implemented by logic gates such as, for example, 4-input OR gates, which output a high level signal when one of the block selection signals $BLS_1$ through $BLS_8$, which is input to the corresponding switching circuits 150, 160, 170 and 180, is activated. Also, the second logic gates 156 and 176 may be implemented by logic gates such as, for example, 2-input AND gates, which activate the corresponding NMOS transistors 152 and 172 only when both the output signals of the corresponding first logic gates 154 and 174 and the column address CAX are activated. The second logic gates 166 and 186 may be implemented by logic gates such as, for example, 2-input AND gates, which activate the corresponding NMOS transistors 162 and 182 only when both the output signals of the corresponding first logic gates 164 and 184 and the inverted column address CAXB are activated.

In a similar manner as in Embodiments 1 and 2, gains of the first through fourth amplifiers $AMP_1$, $AMP_2$, $AMP_3$ and $AMP_4$ for each input/output sense amplifier can be varied by designing the first and second NMOS transistors $N_1$, $N_2$, $N_3$, $N_4$, $N_5$, $N_6$, $N_7$ and $N_8$ to have a different size or to have a different threshold voltage in each amplifier.

It is assumed that in the configuration of an input/output sense amplifier as shown in FIG. 6, the first amplifier $AMP_1$ is designed to have the highest gain among the four amplifiers. When a bit line data, which is from one of the first through fourth memory blocks $BLK_1$ through $BLK_4$ and selected by the upper column selection signals $CSL_1$ through $CSL_M$ (see FIG. 3), is input to the data input/output lines DIOi and DIOiB, the first amplifiers $AMP_1$, which have been designed to have the highest gain, are activated. Meanwhile, when a bit line data, which is from one of the first through fourth memory blocks $BLK_1$ through $BLK_4$ and selected by the lower column selection signals $CSL_{M+1}$ through $CSL_{2M}$, is input to the data input/output lines DIOi and DIOiB, the second amplifiers $AMP_2$, which have been designed to have a lower gain than the first amplifier $AMP_1$, are activated.

In the case where a bit line data, which is from one of the fifth through eighth memory blocks $BLK_5$ through $BLK_8$ and selected by the upper column selection signals $CSL_1$ through $CSL_M$, is input to the data input/output lines DIOi and DIOiB, the third amplifiers $AMP_3$, which have been designed to have a lower gain than the second amplifier $AMP_2$, are activated. Also, when a bit line data, which is from one of the fifth through eighth memory blocks $BLK_5$ through $BLK_8$ and selected by the lower column selection signals $CSL_{M+1}$ through $CSL_{2M}$, is input to the data input/output lines DIOi and DIOiB, the fourth amplifiers $AMP_4$, which have been designed to have a lower gain than the third amplifier $AMP_3$, are activated.

In other words, the switching circuit 150 of the first amplifier $AMP_1$ is controlled by combination of the block selection signals $BLS_1$ through $BLS_4$, which select the first through fourth memory blocks $BLK_1$ through $BLK_4$ that are relatively far away from the input/output sense amplifiers, and the column address CAX which enables the upper column selection signals $CSL_1$ through $CSL_M$. The switching circuit 180 of the fourth amplifier $AMP_4$ is controlled by combination of the block selection signals $BLS_5$ through $BLS_8$, which select the fifth through eighth memory blocks $BLK_5$ through $BLK_8$ that are relatively close to the input/output sense amplifiers, and the inverted column address CAXB which enables the lower column selection signals $CSL_{M+1}$ through $CSL_{2M}$.

In the present embodiment, in designing the input/output sense amplifiers $IOSA_1$ through $IOSA_4$, the position of a selected memory block has been considered in addition to the positions of sub memory blocks within the selected memory block. Compared to Embodiments 1 and 2, the present embodiment more accurately reflects the difference in transfer rate according to the distance from selected memory blocks, which minimizes skew in data $FDO_1$, $FDO_2$, $FDO_3$ and $FDO_4$ (see FIG. 3) output from the input/output sense amplifiers $IOSA_1$, $IOSA_2$, $IOSA_3$ and $IOSA_4$, according to the distance between the selected memory blocks or sub memory blocks.

The present embodiment has introduced the case where each of the input/output sense amplifiers $IOSA_1$, $IOSA_2$, $IOSA_3$ and $IOSA_4$ has four different gains. However, each input/output sense amplifier may be implemented to have more than four gains. For example, in the case of having eight memory blocks, the input/output sense amplifiers $IOSA_1$, $IOSA_2$, $IOSA_3$ and $IOSA_4$ can be controlled by a column address of two or more bits including the MSB, and the inverted column address, or the memory blocks can be divided into four and then the switching circuit of each amplifier is implemented by a 2-input OR gate, such that input/output sense amplifiers having eight gains can be constructed.

Embodiment 4

Figure 7:
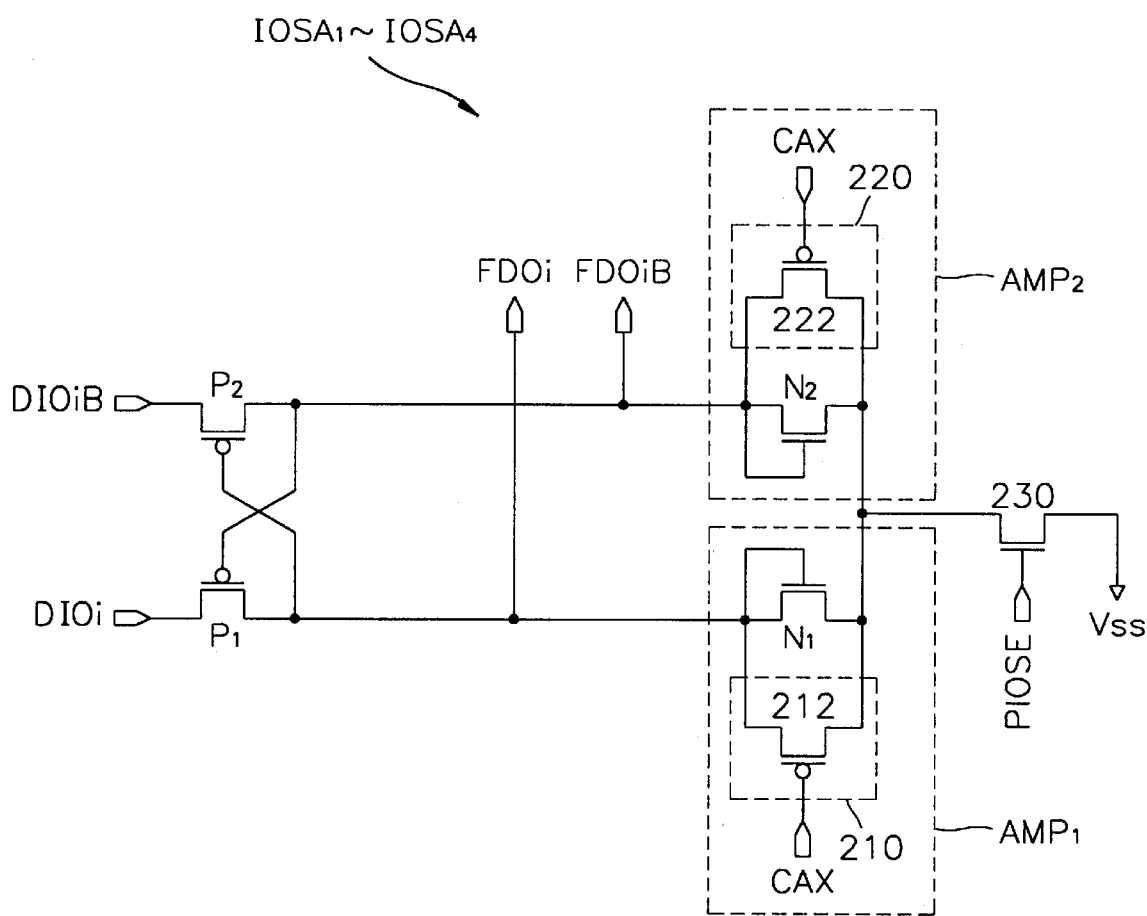
FIG. 7 is a circuit diagram of a fourth embodiment of the IOSAs shown in FIG. 3.

FIG. 7 is a circuit diagram of a fourth embodiment of the input/output sense amplifiers $IOSA_1$, $IOSA_2$, $IOSA_3$ and $IOSA_4$ shown in FIG. 3 according to the present invention. FIG. 7 shows the case where each of the input/output sense amplifiers $IOSA_1$, $IOSA_2$, $IOSA_3$ and $IOSA_4$ includes two amplifiers: first and second amplifiers $AMP_1$ and $AMP_2$. The present embodiment is the same as the Embodiment 1, except that the first and second amplifiers $AMP_1$ and $AMP_2$ comprises compensation circuits 210 and 220, respectively, which are controlled by the column address CAX or the inverted column address CAXB, instead of the switching circuits 110 and 120 of FIG. 4. Thus, except for the configuration of the first and second amplifiers $AMP_1$ and $AMP_2$, an explanation of the configuration or function of the $IOSA_1$, $IOSA_2$, $IOSA_3$ or $IOSA_4$ shown in FIG. 7 is not provided.

In the present embodiment, the first amplifier $AMP_1$ includes an NMOS transistor N1 and a compensation circuit 210, and the second amplifier $AMP_2$ includes an NMOS transistor $N_2$ and a compensation circuit 220. Also, the input/output sense amplifier may further include another NMOS transistor 230, which is controlled by an input/output sense amplifier enable signal PIOSE.

In the NMOS transistors $N_1$ and $N_2$ of the first and second amplifiers $AMP_1$ and $AMP_2$, the gates are coupled to the drains thereof, respectively, and then coupled to drains of the first and second load transistors $P_1$ and $P_2$. As shown in FIG. 7, the compensation circuits 210 and 220 each may be implemented by one PMOS transistor, for example, by PMOS transistors 212 and 222, respectively. The PMOS transistors 212 and 222 are controlled by the column address CAX, thereby improving the current driving capability of the first and second amplifiers $AMP_1$ and $AMP_2$. The NMOS transistor 230 is coupled to both the first and second amplifiers $AMP_1$ and $AMP_2$, and is controlled by the input/output sense amplifier enable signal PIOSE. The first and second amplifiers $AMP_1$ and $AMP_2$ are activated when the NMOS transistor 230 is turned on.

The compensation circuits 210 and 220 are deactivated when a sub memory block that is far away from the input/output sense amplifiers $IOSA_1$, $IOSA_2$, $IOSA_3$ and $IOSA_4$, is selected, and are activated when a sub memory block that is relatively close to the input/output sense amplifiers $IOSA_1$, $IOSA_2$, $IOSA_3$ and $IOSA_4$ is selected. For example, when the upper column selection signals $CSL_1$ through $CSL_M$ (see FIG. 3) are selected by the column address CAX, the PMOS transistors 212 and 222 of the compensation circuits 210 and 220 are controlled by the same column address CAX.

Preferably, the PMOS transistors 212 and 222 of the compensation circuits 210 and 220, respectively, are designed to have an equal size, and the NMOS transistors $N_1$ and $N_2$ of the first and second amplifiers $AMP_1$ and $AMP_2$ are also designed to have an equal size. That is, gains of the first and second amplifier $AMP_1$ and $AMP_2$ are equal.

Unlike Embodiments 1 through 3, current driving capability of each of the first and second amplifiers $AMP_1$ and $AMP_2$ in FIG. 7 is changed according to whether the compensation circuits 210 and 220 are activated, thus causing different gains. That is, when the compensation circuits 210 and 220 of the first and second sense amplifiers $AMP_1$ and $AMP_2$ are activated, current gain is decreased, and otherwise, the current gain is increased.

For example, in the case where the upper column selection signals $CSL_1$ through $CSL_M$ (see FIG. 3) are selected, the column address CAX is asserted to logic high, so that the PMOS transistors 212 and 222 of the compensation circuits 210 and 220 are turned off. Thus, the current driving capability of the first and second amplifiers $AMP_1$ and $AMP_2$ is lowered, increasing the gains of the input/output sense amplifiers. As a result, the data transferred through the data input/output lines DIOi and DIOiB to the input/output sense amplifiers are rapidly sensed and amplified.

Meanwhile, in the case where the lower column selection signals $CSL_{M+1}$ through $CSL_{2M}$ (see FIG. 3) are selected, the column address CAX is asserted to logic low, so that the PMOS transistors 212 and 222 are turned on, and the compensation circuits 210 and 220 are activated. As a result, the current driving capability of the first and second amplifiers $AMP_1$ and $AMP_2$ are increased, reducing the gains of the input/output sense amplifiers. Thus, the data transferred through the data input/output lines DIOi and DIOiB to the input/output sense amplifiers are more slowly amplified than when the compensation circuits 210 and 220 operate.

As mentioned above, when the column selection signals $CSL_1$ through $CSL_M$ that are far away from the input/output sense amplifiers $IOSA_1$, $IOSA_2$, $IOSA_3$ and $IOSA_4$, are selected, a delay in transfer due to a long distance between the selected column selection signals and the input/output sense amplifiers can be compensated for by an increase in the gains of the input/output sense amplifiers $IOSA_1$, $IOSA_2$, $IOSA_3$ and $IOSA_4$. That is, as in Embodiments 1 through 3, skew in data $FDO_1$, $FDO_2$, $FDO_3$ and $FDO_4$ (see FIG. 3) output from the input/output sense amplifiers $IOSA_1$, $IOSA_2$, $IOSA_3$ and $IOSA_4$, according to the positions of the selected sub memory blocks, can be minimized.

The present embodiment has introduced the case where each of the input/output sense amplifiers $IOSA_1$, $IOSA_2$, $IOSA_3$ and $IOSA_4$ has two different gains. However, each input/output sense amplifier may be implemented to have more than two gains. In such cases, the compensation circuits 210 and 220 are controlled by a column address of two or more bits including the MSB, and each of the compensation circuits 210 and 220 is implemented by two or more parallel PMOS transistors. Preferably, the two or more PMOS transistors of each compensation circuit can be controlled by different column addresses, and controlled to have different sizes.

Embodiment 5

Figure 8:
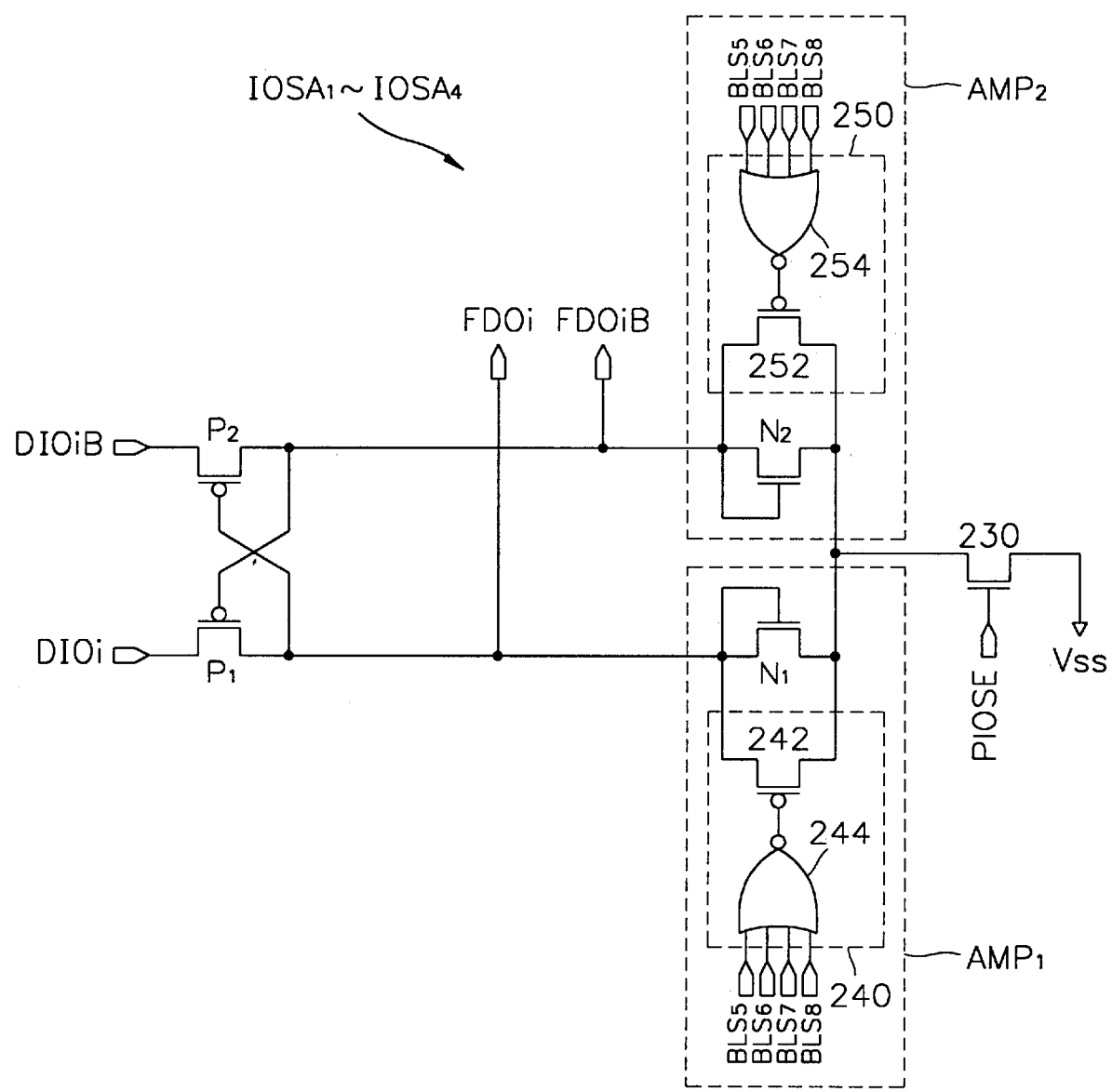
FIG. 8 is a circuit diagram of a fifth embodiment of the IOSAs shown in FIG. 3.

FIG. 8 is a circuit diagram of a fifth embodiment of the input/output sense amplifiers $IOSA_1$, $IOSA_2$, $IOSA_3$ and $IOSA_4$ shown in FIG. 3. In FIG. 8, like reference numerals are used to designate elements which are identical to those of FIG. 7. The present embodiment is the same as Embodiment 4, except that compensation circuits 240 and 250 are designed to be controlled by the block selection signals $BLS_5$ through $BLS_8$, which select the memory blocks $BLK_5$ through $BLK_8$ which are close to the input/output sense amplifiers $IOSA_1$ through $IOSA_4$. Thus, except for the configuration of the compensation circuits 240 and 250, an explanation of the configuration and function of the input/output sense amplifiers $IOSA_1$, $IOSA_2$, $IOSA_3$ or $IOSA_4$ shown in FIG. 8 is the same as that of FIG. 7 and is not provided.

As shown in FIG. 8, each compensation circuit comprises one PMOS transistor and one logic gate: the compensation circuit 240 comprises a PMOS transistor 242 and a logic gate 244, and the compensation circuit 250 comprises a PMOS transistor 252 and a logic gate 254. The PMOS transistors 242 and 252 are controlled by output signals from the logic gates 244 and 254, respectively. The logic gates 244 and 254 may be implemented by logic gates such as, for example, 4-input NOR gates, which activate the PMOS transistors 242 and 252, respectively, when one of the block selection signals input thereinto is activated.

The present embodiment is the same as Embodiment 4 in that gains of the first and second amplifiers $AMP_1$ and $AMP_2$ are decreased by activation of the compensation circuits 240 and 250. However, the compensation circuits 240 and 250 are activated in response to the block selection signals $BLS_5$ through $BLS_8$, instead of the column address CAX (see FIG. 7).

The compensation circuits 240 and 250 are inactivated when a memory block that is relatively far away from the input/output sense amplifiers $IOSA_1$, $IOSA_2$, $IOSA_3$ and $IOSA_4$, is selected by the block selection signals $BLS_1$ through $BLS_4$. Meanwhile, when a memory block that is relatively close to the input/output sense amplifiers $IOSA_1$, $IOSA_2$, $IOSA_3$ and $IOSA_4$ is selected by the block selection signals $BLS_5$ through $BLS_8$, the compensation circuits 240 and 250 are activated. Here, the current gain is decreased with the activation of the compensation circuits 240 and 250, and is increased with the inactivation of the same.

For example, when one of the first through fourth memory blocks $BLK_1$ through $BLK_4$ that are far away from the input/output sense amplifiers $IOSA_1$, $IOSA_2$, $IOSA_3$ and $IOSA_4$ is selected, the PMOS transistors 242 and 252 of the compensation circuits 240 and 250 are turned off, so that current driving capability of the first and second amplifiers $AMP_1$ and $AMP_2$ is decreased, thus increasing the gains of the input/output sense amplifiers $IOSA_1$, $IOSA_2$, $IOSA_3$ and $IOSA_4$. As a result, the data transferred through the data input/output lines DIOi and DIOiB are rapidly sensed and amplified.

Meanwhile, when one of the fifth through eighth memory blocks $BLK_5$ through $BLK_8$ that are relatively close to the input/output sense amplifiers $IOSA_1$, $IOSA_2$, $IOSA_3$ and $IOSA_4$ is selected, the PMOS transistors 242 and 252 are turned on, activating the compensation circuits 240 and 250. As a result, the current driving capability of the first and second amplifiers $AMP_1$ and $AMP_2$ is increased and the gains of the input/output sense amplifiers $IOSA_1$, $IOSA_2$, $IOSA_3$ and $IOSA_4$ are lowered. As a result, the data transferred through the data input/output lines DIOi and DIOiB to the input/output sense amplifiers $IOSA_1$, $IOSA_2$, $IOSA_3$ and $IOSA_4$ is sensed and amplified slowly in contrast to when the compensation circuits 240 and 250 do not operate.

As already described, even when a memory block that is far away from the input/output sense amplifiers $IOSA_1$, $IOSA_2$, $IOSA_3$ and $IOSA_4$ is selected, a delay in transfer due to a long distance between the selected memory block and the input/output sense amplifiers can be compensated for by an increase in the gains of the input/output sense amplifiers $IOSA_1$, $IOSA_2$, $IOSA_3$ and $IOSA_4$. That is, as in Embodiments 1 through 4, skew in data $FDO_1$, $FDO_2$, $FDO_3$ and FDO$_4$ (see FIG. 3) output from the input/output sense amplifiers IOSA$_1$, IOSA$_2$, IOSA$_3$ and IOSA$_4$, according to the positions of the selected memory blocks, can be minimized.

The present embodiment has introduced the case where the input/output sense amplifiers IOSA$_1$, IOSA$_2$, IOSA$_3$ and IOSA$_4$ each have two different gains. However, each input/output sense amplifier may be implemented to have more than two gains. In such cases, each of the compensation circuits 240 and 250 are implemented by two or more parallel PMOS transistors, which are coupled in parallel, and two or more NOR gates for driving the PMOS transistors. Preferably, two or more PMOS transistors of each compensation circuit are designed to have different sizes.

Embodiment 6

Figure 9:
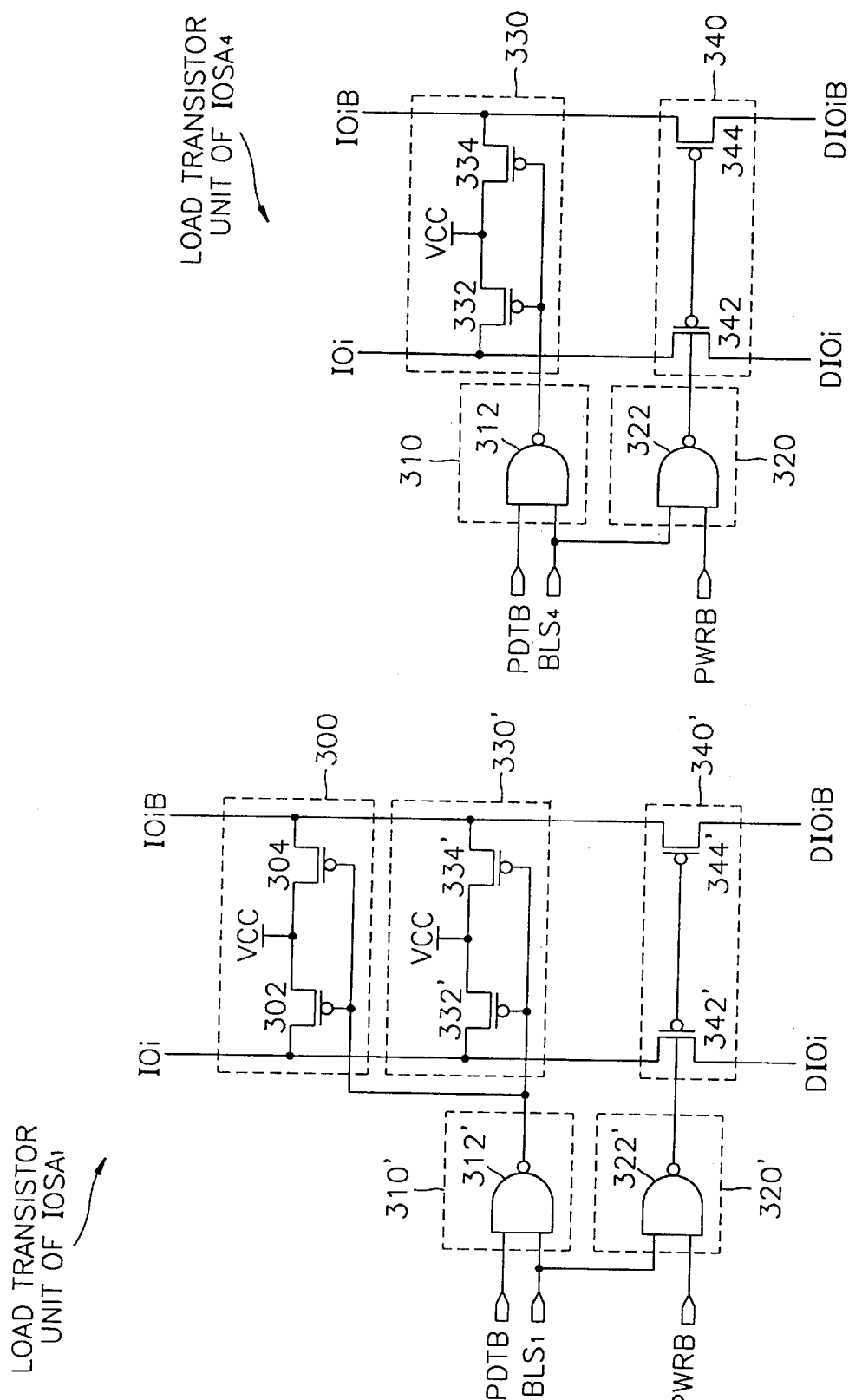
FIG. 9 is a circuit diagram of a sixth embodiment of the IOSAs shown in FIG. 3.

FIG. 9 is a circuit diagram of a sixth embodiment of the input/output sense amplifiers IOSA$_1$, IOSA$_2$, IOSA$_3$ and IOSA$_4$ shown in FIG. 3 according to the present invention. The present embodiment relates to load transistor units which are included in the input/output sense amplifiers IOSA$_1$, IOSA$_2$, IOSA$_3$ and IOSA$_4$ in Embodiments 1 through 5. The load transistor units are positioned below the multiplexers MUX$_1$ through MUX$_4$ (see FIG. 3) which connect the input/output lines IOi and IOiB and the data input/output lines DIOi and DIOiB. A first input/output sense amplifier IOSA$_1$ is set to sense and amplify the data of a memory block that is relatively far away from the input/output sense amplifiers, and a fourth input/output sense amplifier IOSA$_4$ is set to sense and amplify the data of a memory block that is relatively close to the input/output sense amplifiers. It is assumed that a memory block far away from the input/output sense amplifiers is a first memory block BLK$_1$, a memory block close to the input/output sense amplifiers is a fourth memory block BLK$_4$, a block selection signal for selecting the memory block BLK$_1$ is a first block selection signal BLS$_1$, and a block selection signal for selecting the memory block BLK$_4$ is a fourth block selection signal BLS$_4$.

A load transistor unit of the input/output sense amplifier IOSA$_4$ includes a current driving controller 310, a switching controller 320, a current driver 330 and a switching portion 340. The load transistor of the input/output sense amplifier IOSA$_1$ includes a current driving controller 310', a switching controller 320', a current driver 330' and a switching portion 340', like the load transistor unit of the input/output sense amplifier IOSA$_4$, and further includes an auxiliary current driver 300.

The current driving controllers 310 and 310' include 2-input NAND gates 312 and 312', respectively, each of which receives a driving signal PDTB and block selection signals BLS$_4$ and BLS$_1$, respectively. The switching controllers 320 and 320' include 2-input NAND gates 322 and 322', respectively, each of which receives the block selection signals BLS$_4$ and BLS$_1$, respectively, and a write control signal PWRB. Each of the current drivers 330 and 330' includes two load transistors. In particular, the current driver 330 of the input/output sense amplifier IOSA$_4$ includes load transistors 332 and 334 for supplying current to the input/output lines IOi and IOiB in response to the output of the current driving controller 310, and the current driver 330' of the input/output sense amplifier IOSA$_1$ includes load transistors 332' and 334' for supplying current to the input/output lines IOi and IOiB in response to the output of the current driving controller 310'. Each of the switching portions 340 and 340', which connect the input/output lines IOi and IOiB to the data input/output lines DIOi and DIOiB in response to outputs of the switching controllers 320 and 320', respectively. The switching portion 340 includes PMOS transistors 342 and 344, and the switching portion 340' includes PMOS transistors 342' and 344'. The auxiliary current driver 300 of the input/output sense amplifier IOSA$_1$ includes auxiliary load transistors 302 and 304 which supply current to the input/output lines IOi and IOiB in response to the output of the current driving controller 310' as do the current drivers 330 and 330'.

The driving signal PDTB and the write control signal PWRB have a logic low level when a memory device is in a write mode, and go to a logic high level as the mode of the memory device is changed to a read mode. In the write mode, current supply to the input/output lines IOi and IOiB is interrupted by the driving signal PDTB at a logic low level, and the connection between the input/output lines IOi and IOiB and the data input/output lines DIOi and DIOiB is isolated by the write control signal PWRB at a logic low level. This means that data to be written to a memory cell is transferred directly to the input/output lines IOi and IOiB, not via the data input/output lines DIOi and DIOiB. In other words, in a write mode, data is transferred to the input/output lines IOi and IOiB through an input/output driver (not shown) of the memory device and then written to a memory cell.

In the read mode, when both the block selection signal BLS$_4$ for the memory block BLK$_4$ and the driving signal PDTB become a logic high level, the output from the current driving controller 310 of the input/output sense amplifier IOSA$_4$ becomes a logic low level. In response to the output of the current driving controller 310, the load transistors 332 and 334 of the current driver 330 are turned on, so that current is supplied to the input/output lines IOi and IOiB. When both the block selection signal BLS$_4$ and the write control signal PWRB become a logic high level, the output from the switching controller 320 becomes a logic low level. In response to the output of the switching controller 320, the PMOS transistors 342 and 344 of the switching portion 340 are turned on, so that the current supplied to the input/output lines IOi and IOiB by the current driver 330 is transferred to the input/output sense amplifier IOSA$_4$ through the data input/output lines DIOi and DIOiB.

Operation of the input/output sense amplifier IOSA$_1$ is substantially the same as that of the input/output sense amplifier IOSA$_4$, except for the block selection signal BLS$_1$ for the memory block BLK$_1$, which is far away from input/output sense amplifiers, instead of the block selection signal BLS$_4$. When both the block selection signal BLS1 and the driving signal PDTB become a logic high level, the output of the current driving controller 310' becomes a logic low level. In response to the output of the current driving controller 310', the load transistors 302 and 304 of the auxiliary current driver 300 and the load transistors 332' and 334' of the current driver 330' are turned on, thereby increasing the current supply to the input/output lines IOi and IOiB.

As a result, the current driving capability of the input/output sense amplifier IOSA$_1$ for sensing and amplifying the data of the memory block BLK$_1$ that is far away from input/output sense amplifiers is more increased by the auxiliary current driver 300 thereof than that of the input/output sense amplifier IOSA$_4$ for sensing and amplifying the data of the memory block BLK$_4$ that is relatively close to input/output sense amplifiers.

In other words, in the case where the memory block BLK$_1$, which is far away from input/output sense amplifiers, is selected, the load transistors 302 and 304 of the auxiliary current driver 300 are turned on, which allows for an additional current supply to the input/output lines IOi and IOiB, thereby increasing gain of the input/output sense amplifier $IOSA_1$. As a result, the data transferred to the data input/output lines DIOi and DIOiB can be rapidly sensed and amplified, thereby almost simultaneously outputting data $FDO_1$ (see FIG. 3) from the input/output sense amplifier $IOSA_1$ and data $FDO_4$ from the input/output sense amplifier $IOSA_4$, which senses and amplifies data from the memory block $BLK_4$ which is close to the input/output sense amplifiers, without causing skew in data according to the position of selected memory block.

The present embodiment has described a gain variation of input/output sense amplifiers according to current driving capability of load transistors in the input/output sense amplifiers. However, it is appreciated that the load transistor units can be separated from the input/output sense amplifiers. The load transistor units may be arranged between input/output lines and data input/output lines so as to vary the current driving capability for input/output sense amplifiers according to the distance between selected memory blocks and the input/output sense amplifiers. At this time, the input/output sense amplifiers $IOSA_1$ and $IOSA_4$ may have an equal current gain, or a variable current gain as described in previous embodiments.

Example 7

Figure 10:
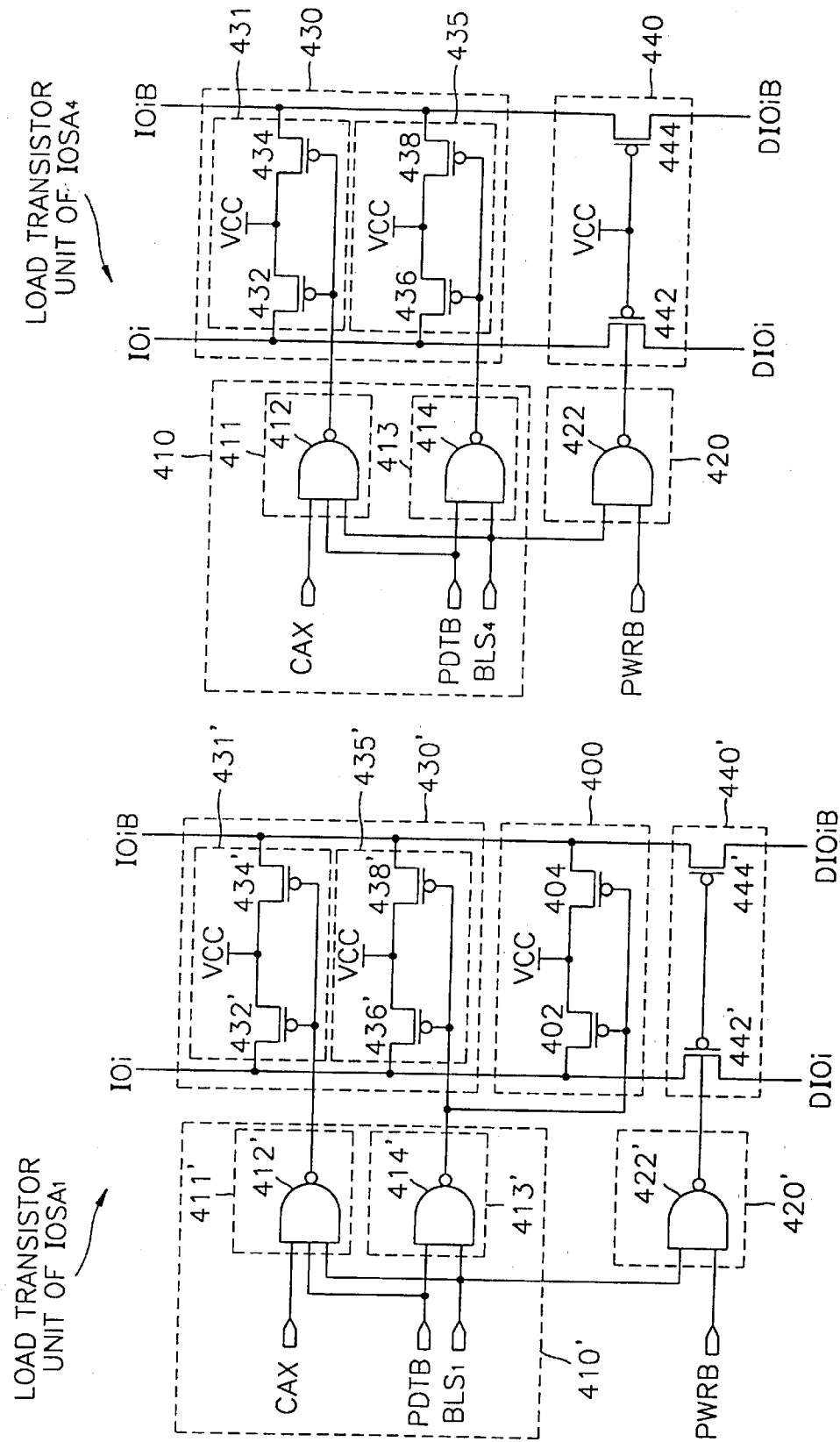
FIG. 10 is a circuit diagram of a seventh embodiment of the IOSAs shown in FIG. 3.

FIG. 10 is a circuit diagram of a seventh embodiment of the input/output sense amplifiers $IOSA_1$, $IOSA_2$, $IOSA_3$ and $IOSA_4$ shown in FIG. 3. In particular, FIG. 10 shows another example of the load transistor units of the input/output sense amplifiers $IOSA_1$ and $IOSA_4$. Similar to Embodiment 6, the input/output sense amplifier $IOSA_1$ is set to sense and amplify data of a memory block which is relatively far away from the input/output sense amplifiers, and the input/output sense amplifier $IOSA_4$ is set to sense and amplify data of a memory block that is relatively close to the input/output sense amplifiers. It is assumed that a memory block far away from the input/output sense amplifiers is a first memory block $BLK_1$, a memory block close to the input/output sense amplifiers is a fourth memory block $BLK_4$, a block selection signal for selecting the memory block $BLK_1$ is a first block selection signal $BLS_1$, and a block selection signal for selecting the memory block $BLK_4$ is a fourth block selection signal $BLS_4$.

The load transistor units of the input/output sense amplifiers $IOSA_1$ and $IOSA_4$ of the present embodiment are substantially the same as those shown in FIG. 9, except for configuration and function of current driving control portions 410 and 410' and current driving portions 430 and 430'. An auxiliary current driver 400 is the same as that of the auxiliary current driver 300 of FIG. 9. Thus, an explanation of configuration and function of the current driving control portions 410 and 410', and the current driving portions 430 and 430', rather than the entire description on input/output sense amplifiers, is provided below.

The current driving control portion 410 of the input/output sense amplifier $IOSA_4$ includes first and second current driving controllers 413 and 411, and the current driving control portion 410' of the input/output sense amplifier $IOSA_1$ includes first and second current driving controllers 413' and 411'. The first current driving controllers 413 and 413' include, for example, 2-input NAND gates 414 and 414', respectively, which receive the block selection signal $BLS_1$ or $BLS_4$, and the driving signal PDTB. The second driving controllers 411 and 411' include, for example, 3-input NAND gates 412 and 412', respectively, which responds to the column address CAX, the block selection signal $BLS_1$ or $BLS_4$, and the driving signal PDTB. The current driver 430 of the input/output sense amplifier $IOSA_4$ includes a first current driver 435 that receives output of the first current driving controller 413, and a second current driver 431 that receives output of the second current driving controller 411. Also, the current driver 430' of the input/output sense amplifier $IOSA_1$ includes a first current driver 435' that receives the output of the first current driving controller 413', and a second current driver 431' that responds to output of the second current driving controller 411'. The first and second current drivers 435 and 431 include first load transistors 436 and 438, and second load transistors 432 and 434, respectively. Also, the first and second current drivers 435' and 431' include first load transistors 436' and 438', and second load transistors 432' and 434', respectively.

The current driving control portions 410 and 410', and the current driving portions 430 and 430' operate as follows. Assuming that outputs of the 3-input NAND gates 412 and 412' of the second current driving controllers 411 and 411', which become a logic low level in response to the column address CAX, the block selection signal $BLS_4$ or $BLS_1$, and the driving signal PDTB, which have a logic high level, are referred to as second current driving signals. The second load transistors 432 and 434 of the second current driving portion 431, and the second load transistors 432' and 434' of the second current driving portion 431' are turned on in response to the second current driving signals having a logic low level, and in turn current is supplied to the input/output lines IOi and IOiB.

At this time, the outputs of the 2-input NAND gates 414 and 414' of the first current driving controllers 413 and 413' become a logic low level in response to the block selection signals $BLS_4$ or $BLS_1$, and the driving signal PDTB, which have a logic high level, and are referred to as first current driving signals. The first load transistors 436 and 438 of the first current driver 435 and the first load transistors 436' and 438' of the first current driver 435' are turned on in response to the first current driving signals, and in turn current is supplied to the input/output lines IOi and IOiB. Thus, the significance of the activation of the second load transistors 432, 434, 432' and 434' lies in that the current can be further supplied to the input/output lines IOi and IOIB when sub block memories that are relatively far away from input/output sense amplifiers, which are divided from a memory block by the column address CAX, are selected.

For example, it is assumed that position of sub memory blocks, which are selected by the upper column selection signals $CSL_1$ through $CSL_M$, is farther away from input/output sense amplifiers than sub memory blocks to be selected by the lower column selection signals $CSL_{M+1}$ through $CSL_{2M}$, as shown in FIG. 3. In the case where the upper column selection signals $CSL_1$ through $CSL_M$ are enabled, the column address CAX becomes a logic high level, and the second load transistors 432, 434, 432' and 434' of the second current drivers 431 and 431' are turned on, which allows additional supply of current to the input/output lines IOi and IOIB. As a result, the data transferred through the input/output lines IOi and IOIB to the data input/output lines DIOi and DIOiB can be rapidly sensed and amplified by the input/output sense amplifiers $IOSA_1$ and $IOSA_4$, thereby almost simultaneously outputting both data selected by the upper column selection signals $CSL_1$ through $CSL_M$ and data selected by the lower column selection signals $CSL_{M+1}$ through $CSL_{2M}$.

The memory device further adopting such load transistor units of the input/output sense amplifiers $IOSA_1$ and $IOSA_4$ according to the present invention regards the position of sub memory blocks within the selected memory block, as well as the position of selected memory block, and thus the data transfer rate can be more accurately controlled compared to Embodiment 6. Thus, the data $FDO_1$, $FDO_2$, $FDO_3$ and $FDO_4$ can be simultaneously output through the input/output sense amplifiers $IOSA_1$, $IOSA_2$, $IOSA_3$ and $IOSA_4$, without skew according to the positions of selected memory and sub memory block.

The present embodiment has described the gain variation in input/output sense amplifiers depending on current driving capability of load transistor units of the input/output sense amplifiers, which are further included in the memory device. However, it is appreciated that load circuits can be separated from the input/output sense amplifiers. The load circuits provide the same function as the load transistors described in the present embodiment, which vary the current supplying capability for input/output lines and data input/output lines according to the distance between selected memory blocks or sub memory blocks therein and the input/output sense amplifier. The load circuits can be arranged between additional input/output lines and data input/output lines. At this time, the input/output sense amplifiers may have an equal current gain, or a variable current gain which has been described in the previous embodiments.

In the drawings and specification, there have been disclosed typical preferred embodiments of the invention and, although specific terms are employed, they are used in a generic and descriptive sense only and not for purposes of limitation, the scope of the invention being set fourth in the following claims. Although the preferred embodiment is described in reference to eight memory blocks, the number of memory blocks can be ten or more. Thus, it will be understood by those skilled in the art that various changes in form and details may be made therein without departing from the spirit and scope of the invention as defined by the appended claims.

What is claimed is:

1. A semiconductor memory device comprising:
a plurality of sub memory blocks divided by a column address in a memory block;
a plurality of data input/output line pairs coupled to the sub memory blocks, for transmitting data in a selected sub memory block; and
a plurality of input/output sense amplifiers for sensing and amplifying data from the data input/output line pairs,
wherein each of the input/output sense amplifiers has a variable gain characteristic depending on distance between the selected sub memory block and the input/output sense amplifiers so as to minimize a difference in delay characteristic according to position of the selected sub memory block.

2. The semiconductor memory device of claim 1, wherein a gain of each of the input/output sense amplifiers is controlled by the column address.

3. The semiconductor memory device of claim 1, wherein each of the input/output sense amplifiers comprises:
first and second load transistors sources of which are connected to one of the data input/output line pairs, and gates of which are cross-coupled with drains thereof; and
at least two amplifiers which are selectively activated in response to the column address, for amplifying data transferred from the first and second load transistors with different gains.

4. The semiconductor memory device of claim 3, wherein each of the at least two amplifiers comprises:

first and second transistors each of which has a gate and a drain coupled to each other, drains of the first and second transistors being connected to drains of the first and second load transistors, respectively; and
a switching circuit connected between sources of the first and second transistors and a ground voltage, for activating the corresponding amplifier in response to the column address.

5. The semiconductor memory device of claim 3, wherein each of the at least two amplifiers comprises:
an NMOS transistor having a gate and a drain, which are coupled to each other and coupled to a drain of a corresponding one of the first and second load transistors; and
a compensation circuit coupled to the NMOS transistor in parallel, the compensation circuit being controlled by the column address;
wherein a switching circuit is coupled between sources of NMOS transistors of the at least two amplifiers and a ground voltage, for activating the input/output sense amplifiers in response to an input/output sense amplifying enable signal.

6. A semiconductor memory device comprising:
a plurality of memory blocks;
a plurality of data input/output line pairs coupled to the memory blocks, respectively, for transmitting data in a selected memory block; and
a plurality of input/output sense amplifiers for sensing and amplifying data from the data input/output line pairs,
wherein each of the input/output sense amplifiers has a variable gain characteristic depending on distance between the selected memory block and the input/output sense amplifiers so as to minimize a difference in delay characteristic according to position of the selected memory block.

7. The semiconductor memory device of claim 6, wherein a gain of each of the input/output sense amplifiers is controlled by a block selection signal which selects one of the plurality of memory blocks.

8. The semiconductor memory device of claim 6, wherein each of the input/output sense amplifiers comprises:
first and second load transistors sources of which are connected to one of the data input/output line pairs, and gates of which are cross-coupled with drains thereof; and
at least two amplifiers which are selectively activated in response to a block selection signal, for amplifying data transferred through the first and second load transistors with different gains.

9. The semiconductor memory device of claim 8, wherein each of the at least two amplifiers comprises:
first and second NMOS transistors each of which has a gate and a drain coupled to each other, drains of the first and second NMOS transistors being connected to drains of the first and second load transistors, respectively; and
a switching circuit connected between sources of the first and second NMOS transistors and a ground voltage, for activating the corresponding amplifier in response to the block selection signal.

10. The semiconductor memory device of claim 9, wherein the switching circuit comprises:
a logic gate for receiving a plurality of block selection signals and generating a control signal when one of the block selection signals is activated; and an NMOS transistor for activating the corresponding switching circuit in response to the control signal.

11. The semiconductor memory device of claim 8, wherein each of the at least two amplifiers comprises:
an NMOS transistor having a gate and a drain, which are coupled to each other and coupled to a drain of a corresponding one of the first and second load transistors; and
a compensation circuit coupled to the NMOS transistor in parallel, the compensation circuit being controlled by the block selection signal;
wherein a switching circuit is coupled between sources of NMOS transistors of the at least two amplifiers and a ground voltage, for activating the input/output sense amplifiers in response to an input/output sense amplifying enable signal.

12. A semiconductor memory device comprising:
a plurality of memory blocks;
a plurality of sub memory blocks divided by a column address in each memory block;
a plurality of data input/output line pairs coupled to the memory blocks, respectively, for transmitting data in a selected sub memory block; and
a plurality of input/output sense amplifiers for sensing and amplifying data from the data input/output line pairs,
wherein each of the input/output sense amplifiers has a variable gain characteristic depending on distance between a selected memory block and the input/output sense amplifiers and distance between the selected sub memory block and the input/output sense amplifiers, so as to minimize a difference in delay characteristic according to positions of the selected memory block and the selected sub memory block.

13. The semiconductor memory device of claim 12, wherein gains of the input/output sense amplifiers are controlled by a block selection signal which selects one of the plurality of memory blocks, and the column address.

14. The semiconductor memory device of claim 12, wherein each of the input/output sense amplifiers comprises:
first and second load transistors sources of which are connected to one of the data input/output line pairs, and gates of which are cross-coupled with drains thereof; and
at least two amplifiers which are selectively activated in response to a block selection signal and the column address, for amplifying data transferred through the first and second load transistors with different gains.

15. The semiconductor memory device of claim 14, wherein each of the at least two amplifiers comprises:
first and second NMOS transistors each of which has a gate and a drain coupled to each other, drains of the first and second NMOS transistors being connected to drains of the first and second load transistors, respectively; and
a switching circuit connected between sources of the first and second NMOS transistors and a ground voltage, for activating the corresponding amplifier in response to the block selection signal and the column address.

16. The semiconductor memory device of claim 15, wherein the switching circuit comprises:
a logic gate for receiving a plurality of block selection signals and generating a control signal when one of the block selection signals is activated; and
an NMOS transistor for activating the corresponding switching circuit in response to the control signal.

17. The semiconductor memory device of claim 14, wherein each of the at least two amplifiers comprises:
an NMOS transistor having a gate and a drain, which are coupled to each other and coupled to a drain of a corresponding one of the first and second load transistors; and
a compensation circuit coupled to the NMOS transistor in parallel, the compensation circuit being controlled by the block selection signal;
wherein a switching circuit is coupled between sources of NMOS transistors of the at least two amplifiers and a ground voltage, for activating the input/output sense amplifiers in response to an input/output sense amplifying enable signal.

18. A semiconductor memory device comprising:
a plurality of sub memory blocks divided by a column address in a memory block;
a plurality of input/output lines coupled to the sub memory blocks, for transmitting data in a selected sub memory block;
a plurality of data input/output lines to which data of the input/output lines is transmitted;
a plurality of input/output sense amplifiers for sensing and amplifying data from the data input/output lines; and
a plurality of load circuits coupled between the input/output lines and the data input/output lines, for varying amount of current supplied to the input/output line in response to the column address so as to minimize a difference in delay characteristic according to position of the selected sub memory block.

19. The semiconductor memory device of claim 18, wherein each of the load circuits comprises:
a current driving controller for generating a current driving signal in response to the column address and a driving signal which is activated in a read mode of the semiconductor memory device;
a switching controller for generating a switching signal in response to the column address and a control signal which is activated in the read mode;
a current driver for supplying current to the input/output lines in response to the current driving signal; and
a switching portion for connecting the input/output lines and the data input/output lines, respectively, in response to the switching signal.

20. The semiconductor memory device of claim 19, wherein at least one of the load circuits further comprises an auxiliary current driver for supplying current to the input/output lines in response to the current driving signal.

21. A semiconductor memory device comprising:
a plurality of memory blocks;
a plurality of input/output lines coupled to the memory blocks, respectively, for transmitting data in a selected memory block;
a plurality of data input/output lines to which data of the input/output lines are transmitted;
a plurality of input/output sense amplifiers for sensing and amplifying data from the data input/output lines, and
a plurality of load circuits coupled between the input/output lines and the data input/output lines, for varying amount of current supplied to the input/output lines, in response to a plurality of block selection signals for selecting one of the memory blocks, so as to minimize a difference in delay characteristic from the input/output sense amplifiers according to position of the selected memory block.

22. The semiconductor memory device of claim 21, wherein each of the load circuits comprises:
- a current driving controller for generating a current driving signal in response to the block selection signals and a driving signal which is activated in a read mode of the semiconductor memory device;
- a switching controller for generating a switching signal in response to the block selection signals and a control signal which is activated in the read mode;
- a current driver for supplying current to the input/output lines in response to the current driving signal; and
- a switching portion for connecting the input/output lines and the data input/output lines, respectively, in response to the switching signal.

23. The semiconductor memory device of claim 22, wherein at least one of the load circuits further comprises an auxiliary current driver for supplying current to the input/output lines in response to the current driving signal.

24. A semiconductor memory device comprising:
- a plurality of memory blocks;
- a plurality of sub memory blocks divided by a column address in each memory block;
- a plurality of input/output lines coupled to the memory blocks, respectively, for transmitting data in a selected sub memory block;
- a plurality of data input/output lines to which data of the input/output lines are selectively transmitted;
- a plurality of input/output sense amplifiers for sensing and amplifying data from the data input/output lines; and
- a plurality of load circuits coupled between the input/output lines and the data input/output lines, for varying amount of current supplied to the input/output lines in response to a plurality of block selection signals for selecting one of the memory blocks and the column address, so as to minimize a difference in delay characteristic according to positions of a selected memory block and the selected sub memory block.

25. The semiconductor memory device of claim 24, wherein each of the load circuits comprises:
- a first current driving controller for generating a first current driving signal in response to a block selection signal and a driving signal which is activated in a read mode of the semiconductor memory device;
- a switching controller for generating a switching signal in response to the block selection signal and a control signal which is activated in the read mode;
- a first current driver for supplying current to the input/output lines in response to the first current driving signal; and
- a switching portion for connecting the input/output lines and the data input/output lines, respectively, in response to the switching signal.

26. The semiconductor memory device of claim 25, wherein at least one of the load circuits further comprises an auxiliary current driver for supplying current to the input/output lines in response to the first current driving signal.

27. The semiconductor memory device of claim 25, wherein each of the load circuits further comprises:
- a second current driving controller for generating a second current driving signal in response to the block selection signal, the column address and the driving signal which is activated in a read mode of the semiconductor memory device; and
- a second current driver for supplying current to the input/output lines in response to the second current driving signal.

28. The semiconductor memory device of claim 27, wherein at least one of the load circuits further comprises an auxiliary current driver for supplying current to the input/output lines in response to the first current driving signal.

* * * * *